(12) United States Patent
Yeh et al.

(10) Patent No.: US 6,486,057 B1
(45) Date of Patent: Nov. 26, 2002

(54) PROCESS FOR PREPARING CU DAMASCENE INTERCONNECTION

(75) Inventors: Ching-Fa Yeh, Hsinchu (TW); Yueh-Chuan Lee, Hsinchu (TW); Chien-Hsing Lin, Hsinchu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 10/107,146

(22) Filed: Mar. 28, 2002

(30) Foreign Application Priority Data

Apr. 12, 2001 (TW) .................................. 90108745 A

(51) Int. Cl.[7] .......................................... H01L 21/4763
(52) U.S. Cl. ...................... 438/633; 438/623; 438/637; 438/640; 438/673; 438/687; 438/692
(58) Field of Search ................. 438/633, 523, 438/652–629, 637–640, 687, 672, 673, 668, 675, 643, 653, 690–692

(56) References Cited

U.S. PATENT DOCUMENTS

| | | | |
|---|---|---|---|
| 6,184,126 B1 * | 2/2001 | Lee et al. ................. | 438/623 |
| 6,224,758 B1 * | 5/2001 | Jainek et al. ............ | 210/130 |
| 6,251,753 B1 | 6/2001 | Yeh et al. ................ | 438/445 |
| 6,277,755 B1 * | 8/2001 | Chen et al. .............. | 438/700 |
| 6,413,879 B1 * | 7/2002 | Maeda .................... | 438/758 |

* cited by examiner

Primary Examiner—Tuan H. Nguyen
Assistant Examiner—Thanh Nguyen
(74) Attorney, Agent, or Firm—Bacon & Thomas, PLLC

(57) ABSTRACT

The present invention discloses a technique of enhancing adhesion between a passivation layer and a low-K dielectric layer, in which a SiO$_2$ layer as the passivation formed on the low-K dielectric layer is subjected to N2O plasma annealing. This technique is useful in improving the yield of a process for preparing Cu damascene interconnection.

7 Claims, 5 Drawing Sheets

PROCESS FOR PREPARING CU DAMASCENE INTERCONNECTION

FIELD OF THE INVENTION

The present invention relates to a process for preparing a Cu damascene interconnection, particularly a process for preparing a Cu damascene interconnection with an improved yield.

BACKGROUND OF THE INVENTION

In the damascene of copper in a low dielectric material, a copper line structure is formed by forming trenches in a low dielectric layer by using an active ionic etching, depositing copper on the whole surface (including filling the trench with copper), and using a chemical mechanical polishing (CMP) to polish off the copper on the surface and leaving copper in the trenches.

A photoresist is used as a mask layer when the active ionic etching is carried out. In order to protect the organic low dielectric layer from damage during the stripping of the photoresist mask layer, a passivation layer is required between the photoresist and the organic low dielectric layer [J. M. Neirynck, R. J. Gutmann, and S. P. Murarka, J. Electrochem. Soc., 1602, (1999); D. T. Price, R. J. Gutmann, and S. P. Murarka, Thin Solid Films, 308–309, 523 (1997)]. However, due to a poor adhesion between the passivation layer and the low dielectric layer, the deposited copper layer is torn off from the surface and the trenches during the CMP process. As a result, a copper damascene interconnection can not be completed.

SUMMARY OF THE INVENTION

The present invention provides a process for preparing a Cu damascene interconnection, which comprises forming a low-K dielectric layer on a substrate; forming a passivation layer on said low-K dielectric layer; forming a plurality of trenches on said low-K dielectric layer/passivation layer; forming a pad oxidation layer on the inner walls of each of said plurality of trenches; forming a barrier metal layer on said pad oxidation layer; depositing copper on the resulting structure; and chemical mechanical polishing said copper until said passivation layer is exposed, thereby forming a Cu damascene interconnection on said low-K dielectric layer, characterized in subjecting said passivation layer/low-K dielectric layer with a $N_2O$ plasma annealing prior to the formation of said plurality of trenches.

The present invention uses said $N_2O$ plasma annealing to improve the yield of the process for preparing a Cu damascene interconnection.

Preferably, said $N_2O$ plasma annealing uses the following conditions: $N_2O$ flow rate 50~1000 sccm, pressure 10~1000 mTorr, temperature of plate 20~450° C., radio frequency power 50~1000 W, and processing time 1~100 minutes.

Preferably, said low-K dielectric layer is hydrogen silsesquiuxane or methyl silsesquioxane.

Preferably, said passivation layer is $SiO_2$ or SiNx, wherein 0<x<1.4. More preferably, said passivation layer is $SiO_2$, particularly a $SiO_2$ deposited by a chemical vapor phase deposition (CVD).

BRIEF DESCRIPTION OF THE FIGURES

FIGS. 3(a) to 3(c) separately show the optical microscopic photos of a Cu damascene interconnection prepared according to the present invention, wherein FIG. 3(a) is 200×, FIG. 3(b) is 500×, and FIG. 3(c) is 1000×;

FIGS. 4(a) to 4(c) separately show the electron microscopic photos of a Cu damascene interconnection prepared by a conventional process, wherein FIG. 4(a) is 5000×, FIG. 4(b) is 10000×, and FIG. 4(c) is 5000×.

DETAILED DESCRIPTION OF THE INVENTION

Figure 1:
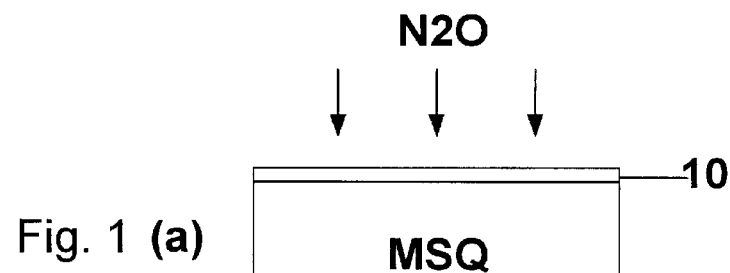
FIGS. 1(a) to 1(e) show the schematic sectional view of the device in the essential steps for preparing a Cu damascene interconnection according to the present invention.
Figure 1:
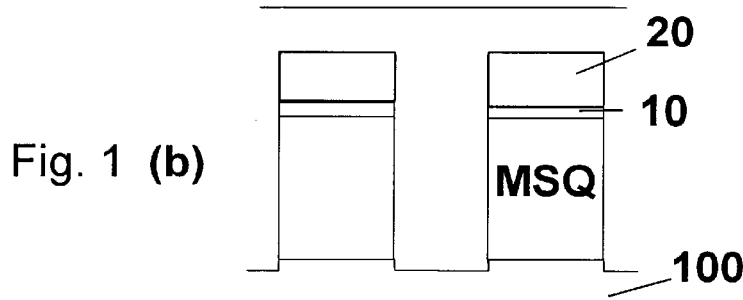
Figure 1:
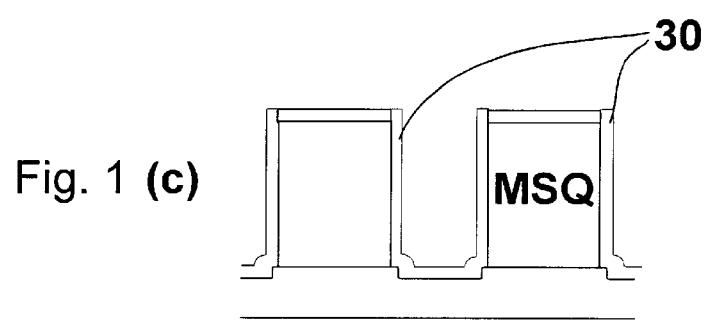
Figure 1:
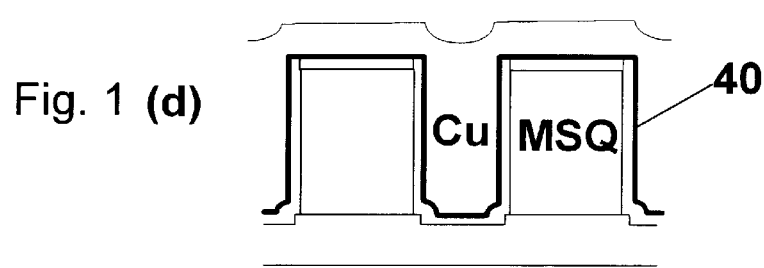
Figure 1:
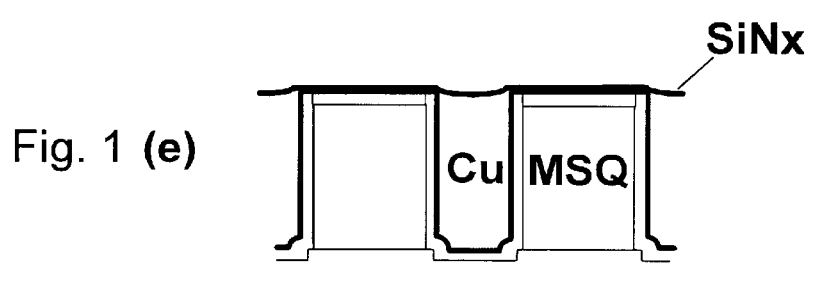

The present invention proposes using a CVD $SiO_2$ treated by a $N_2O$ plasma annealing as a passivation layer in a Cu damascene interconnection structure. The CVD $SiO_2$ formed on the surface of the organic low-K dielectric layer (e.g. hydrogen silsesquiuxane or methyl silsesquioxane (MSQ)) will form a re-bonding with the organic low-K dielectric layer during the $N_2O$ plasma annealing treatment, thereby increasing the adhesion therebetween. As a result, the lamination can withstand the tearing force generated during the subsequent CMP on the copper metal layer.

In the following text, a low-K (~2.8) dielectric MSQ was used as an example. Such a MSQ was covered by a $SiO_2$ formed by a chemical vapor phase deposition (CVD), and then was subjected to a $N_2O$ plasma annealing treatment to form a passivation layer, or just simply covered by a simple SiNx as a passivation layer. After the CMP, a planar evaluation on the resulting copper lines whether they remain intact in the trenches of the organic low-K dielectric layer or not was used to verify the improvement and applicability of the present invention.

According to a preferred embodiment of the present invention, a damascene structure of copper/low-K dielectric layer was prepared by the following steps, as shown in FIGS. 1(a) to 1(e).

spin-coating an organic low-K dielectric layer (MSQ) (thickness 4000 Å) on a wet oxide layer 100;

covering said MSQ layer with a layer of $SiO_2$ 10 (thickness 500 Å) as a passivation layer by plasma-enhanced chemical vapor phase deposition [T. Rukuda, T. Ohshima, H. Aoki, H. Maruyama, H. Miyazaki, N. Konishi, S. Fukada, T. Yunogami, S. Hotta, S. Maekawa, K. Hinode, K. Nojiri, T. Tokunaga, and N. Kobayashi, in Tech. Dig. IEEE Int. Electron Devices Meeting. (IEDM), 619 (1999)], wherein tetraethoxysilane (TEOS) was used as a precursor of said $SiO_2$;

performing said $N_2O$ plasma annealing in a parallel plate type plasma enhanced deposition device under the following working conditions: $N_2O$ gas flow rate 200 sccm, temperature of the upper/lower plates 250/300° C., radio frequency power 200 W, internal pressure of the reaction chamber 200 mTorr, and processing time 15 minutes (FIG. 1(a));

spin coating a photoresist on the passivation layer 10, imagewise exposing and developing the photoresist to form a patterned photoresist 20, and forming a plurality of trenches in the MSQ layer by active ionic etching said passivation layer 10 and the MSQ layer by using said patterned photoresist as a mask layer (FIG. 1(b));

prior to the removal of said photomask, using a selective liquid phase deposition to grow $SiO_2$ (300Å) on the side walls and the bottoms of said trenches as a pad oxidation layer 30 (C. F. Yeh, Y. C. Lee, Y. C. Su, K. H. Wu, and C. H. Lin, "Novel Sidewall Capping for Degradation-Free Damascene Trenches of Low-Permitivity Methylsilsesquioxane", Jpn. J. Appl. Phys., Vol.39, Part 2, p.354–p.356, 2000; USP 6,251,753B1), thereby protecting said side walls and the bottoms from being damaged by the subsequent oxygen plasma treatment; stripping the patterned photoresist by using oxygen plasma ashing, and cleaning in $H_2SO_4/H_2O_2$ solution ($H_2SO_4/H_2O_2=3:1$) afterward, thereby completely removing said photomask (FIG. 1(c));

vacuum sputtering TiN (300Å) as a barrier metal layer 40 and Cu (10000Å) (FIG. 1(d));

using a two-stage chemical mechanical polishing (CMP) process to polish off Cu and TiN (barrier metal layer 40) until said passivation layer 10 was exposed (the detailed operation conditions of the CMP process is listed in Table 1), and immediately covering the exposed surface with SiNx to prevent oxidation of Cu, thereby completing the preparation of the Cu damascene interconnection (FIG. 1(e)).

TABLE 1

| | Function | Composition of Slurry | Removal Rate (nm/min) | Selectivity |
| --- | --- | --- | --- | --- |
| Stage 1 | Cu removal | • $HNO_3$ 3 wt. %<br>• citric acid $10^{-3}$M<br>• $Al_2O_3$ 3 wt. % | 600 | — |
| Stage 2 | TiN removal | • Bayer's 456417F9 50 vol. %<br>• $H_2O_2$ 3 wt. %* | 168 | 6.7 (to Cu) |

*absolute concentration

Said passivation layer 10 has a function of preventing said organic low-K dielectric layer MSQ from being damaged by said oxygen plasma treatment.

Figure 2:
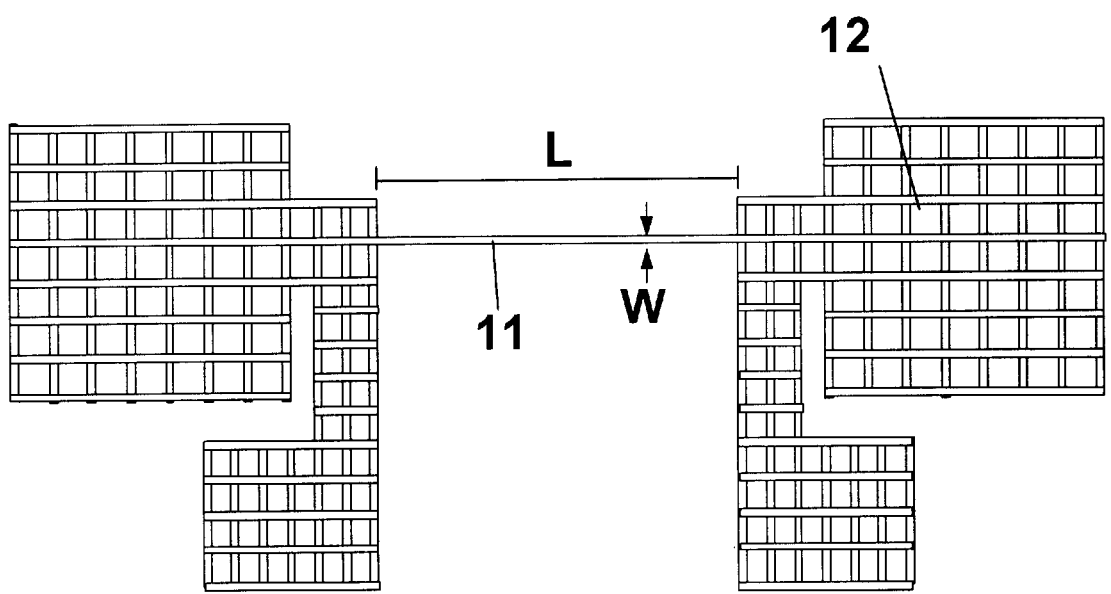
FIG. 2 shows the structural layout of a Cu damascene interconnection.
Figure 3:
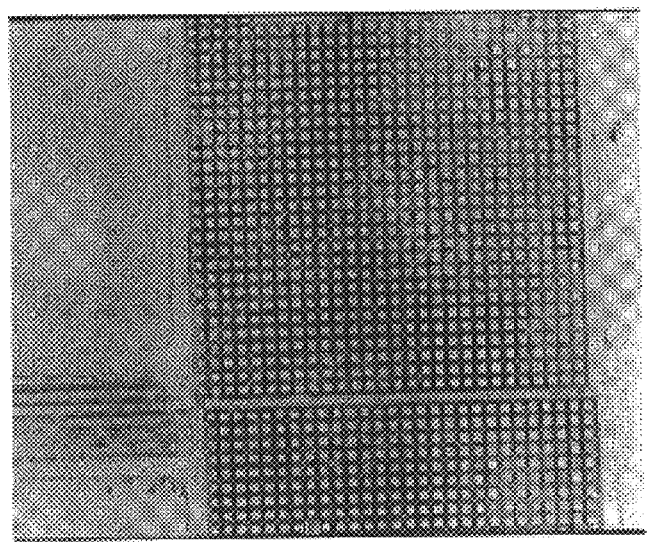
Figure 3:
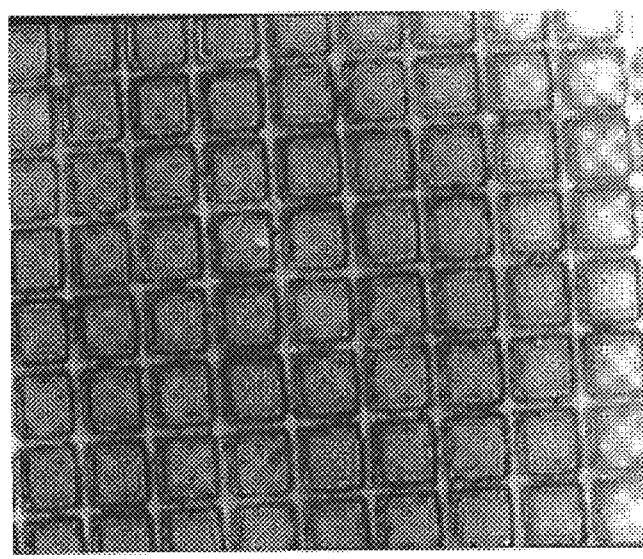
Figure 3:
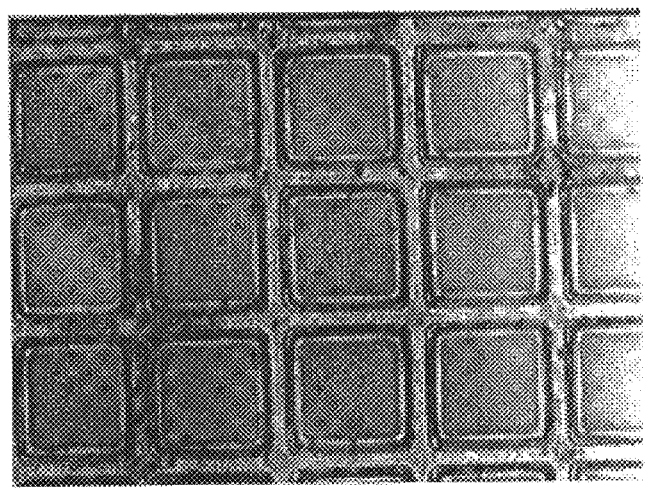

A Cu damascene interconnection with a structure layout as shown in FIG. 2 was prepared according to by the abovementioned preferred embodiment of the present invention, wherein the middle portion is a Cu line 11 with length×width (L×W)=500 μm×2 μm, and the two sides are Cu line pads 12. A net-shaped pad was particularly used for avoiding the occurrence of a dishing effect during the CMP process. Furthermore, a net-shaped Cu pad was also be used to observe the adhesion between copper and the low-K dielectric layer MSQ in this portion during the CMP process as to whether the copper is intact in the trenches. As shown in FIGS. 3(a) to 3(c) ((a) 200×, (b) 500×, and (c) 1000×), the Cu damascene interconnection prepared according to the present invention show no peeling off between the copper and the organic low-K dielectric layer MSQ after the CMP process, and the copper remains in the trench intact.

Figure 4:
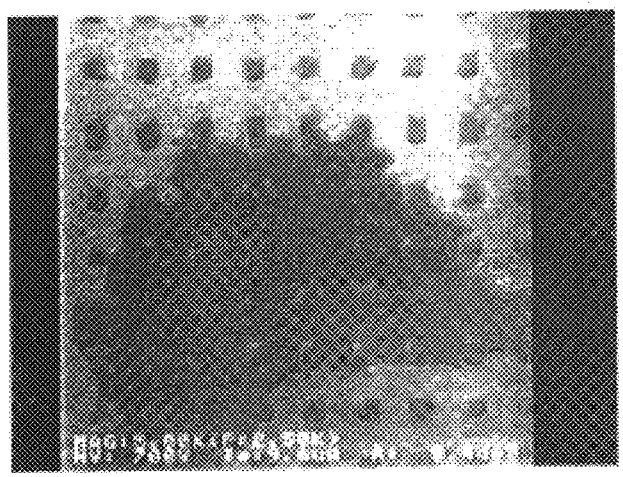
Figure 4:
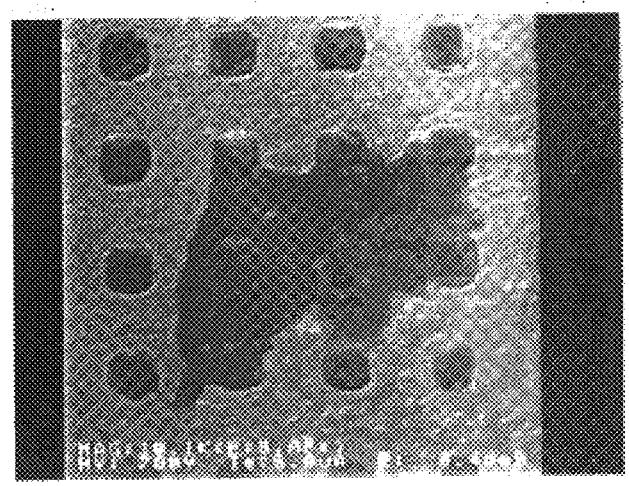
Figure 4:
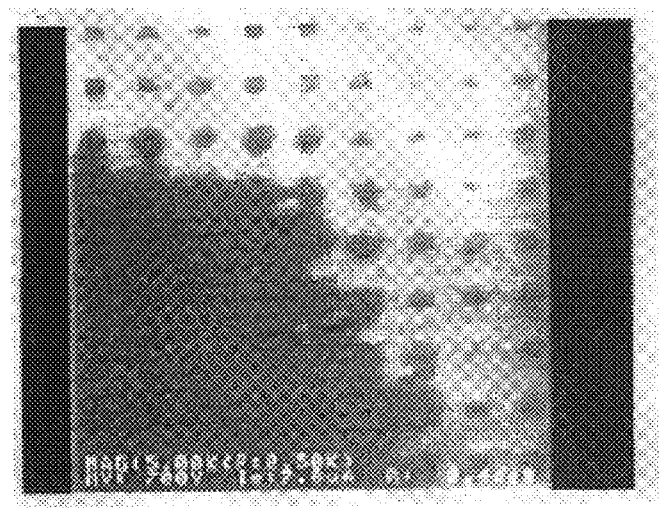

The $N_2O$-plasma-annealing treated passivation layer 10 was replaced by a SiNx layer in a control example. As shown in the scanning electron microscopy (SEM) photos of FIGS. 4(a)–4(c) ((a) 5000×, (b) 10000×, (c) 5000×), the copper is pulled out from the trenches completely (as shown in FIGS. 4(a) and (b)) after the CMP process in the control example, and even the organic low-K dielectric layer MSQ is pulled out together (as shown in FIG. 4(c)). This could be resulted from a poor adhesion between the SiNx and the organic low-K dielectric layer MSQ.

On the other hand, the passivation layer 10 of the present invention, which is $SiO_2$ formed by a chemical vapor phase deposition and subjected to a $N_2O$ plasma annealing, is believed having a re-bonding with the surface of the organic low-K dielectric layer MSQ, thereby increasing the adhesion therebetween.

Figure 5:
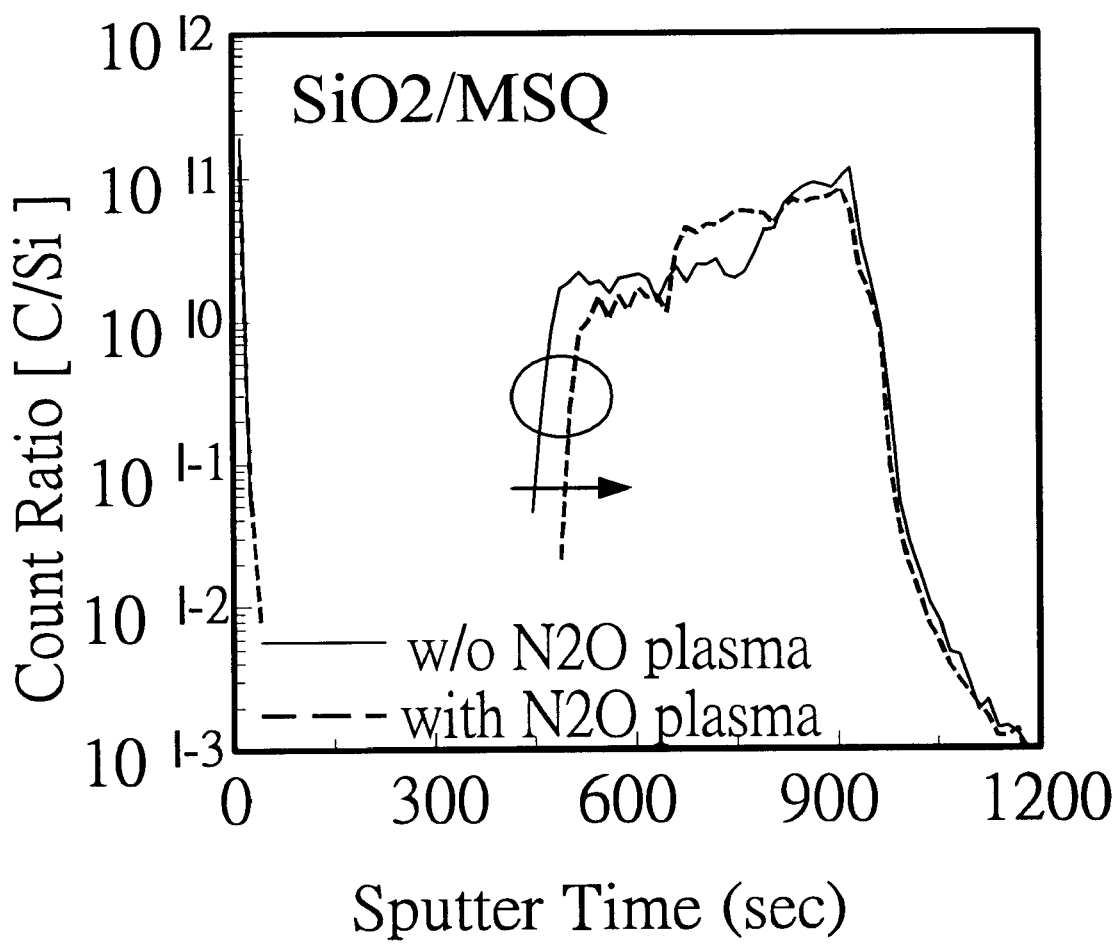
FIG. 5 is a plot of C/Si count ratio vs. sputter time (sec) in a secondary ion mass spectrum (SIMS) analysis of a 500 Å $SiO_2$/MSQ with/without $N_2O$ plasma annealing, wherein the dash line represents the sample with $N_2O$ plasma annealing and the solid line represents the sample without $N_2O$ plasma annealing.

In order to understand whether the $N_2O$ plasma annealing will cause a re-bonding between the $SiO_2$ deposited by a chemical vapor phase deposition and the surface of said organic low-K dielectric layer, a secondary ion mass spectrum (SIMS) analysis was carried out on said organic low-K dielectric layer (MSQ) covered with the chemical vapor phase deposited $SiO_2$, wherein comparisons were made between specimens with or without the $N_2O$ plasma annealing. The results are shown in FIG. 5. It can be seen from FIG. 5 that, after the $N_2O$ plasma annealing, an oxidation seems to occur on the surface of the organic low-K dielectric layer. The profile of C/Si count ratio vs. sputter time of the sample with $N_2O$ plasma annealing shifts to the right, indicating that there is a re-bonding on the surface of the organic low-K dielectric layer in the sample with $N_2O$ plasma annealing. Therefore, it might be concluded that the $N_2O$ plasma annealing can increase the adhesion between the chemical-vapor-phase-deposited $SiO_2$ and the organic low-K dielectric layer.

What is claimed is:

1. A process for preparing a Cu damascene interconnection comprising the following steps:

forming a low-K dielectric layer on a substrate;

forming a passivation layer on said low-K dielectric layer;

subjecting said passivation layer/low-K dielectric layer to a $N_2O$ plasma annealing treatment;

forming a plurality of trenches on said low-K dielectric layer/passivation layer;

forming a pad oxidation layer on side walls of each of said plurality of trenches;

forming a barrier metal layer on said pad oxidation layer;

depositing copper on the resulting structure; and chemical mechanical polishing said copper until said passivation layer is exposed, thereby forming a Cu damascene interconnection on said low-K dielectric layer.

2. The process as claimed in claim 1, wherein said $N_2O$ plasma annealing improves the yield of the process for preparing a Cu damascene interconnection.

3. The process as claimed in claim 1, wherein said $N_2O$ plasma annealing treatment uses the following conditions: $N_2O$ flow rate 50~1000 sccm, pressure 10~1000 mTorr, temperature of plate 20~450° C., radio frequency power 50~1000 W, and processing time 1~100 minutes.

4. The process as claimed in claim 1, wherein said low-K dielectric layer is hydrogen silsesquiuxane or methyl silsesquixane.

5. The process as claimed in claim 1, wherein said passivation layer is $SiO_2$ or $SiN_x$, wherein $0<x<1.4$.

6. The process as claimed in claim 5, wherein said passivation layer is $SiO_2$.

7. The process as claimed in claim 6, wherein said $SiO_2$ is a $SiO_2$ deposited by a chemical vapor phase deposition.

* * * * *